United States Patent [19]
Mizukoshi et al.

[11] Patent Number: 6,090,301
[45] Date of Patent: Jul. 18, 2000

[54] METHOD FOR FABRICATING BUMP FORMING PLATE MEMBER

[75] Inventors: Masataka Mizukoshi; Ichiro Yamaguchi; Masahiro Yoshikawa; Koki Otake; Junichi Kasai, all of Kawasaki, Japan

[73] Assignee: Fujitsu Limited, Kawasaki, Japan

[21] Appl. No.: 08/848,717

[22] Filed: May 19, 1997

[30] Foreign Application Priority Data

Dec. 2, 1996 [JP] Japan ..................................... 8-321628

[51] Int. Cl.$^7$ ................................................. H01L 21/302
[52] U.S. Cl. ............................... 216/17; 216/18; 216/39; 216/56; 216/99; 438/613; 438/616
[58] Field of Search .................... 216/13, 18, 39, 216/52, 56, 99, 17; 438/928, 977, 613, 616

[56] References Cited

U.S. PATENT DOCUMENTS

| | | | |
|---|---|---|---|
| 3,423,823 | 1/1969 | Ansley | 438/977 |
| 4,642,163 | 2/1987 | Greschner et al. | 216/13 |
| 4,867,839 | 9/1989 | Sato et al. | 216/18 |
| 4,902,377 | 2/1990 | Berglund et al. | 216/18 |
| 5,145,552 | 9/1992 | Yoshizawa et al. | 216/18 |
| 5,164,336 | 11/1992 | Ohno et al. | 437/220 |
| 5,308,415 | 5/1994 | Chou | 216/20 |
| 5,323,535 | 6/1994 | Sakaki et al. | 216/18 |
| 5,334,279 | 8/1994 | Gregoire | 216/20 |
| 5,860,585 | 1/1999 | Rutledge et al. | 228/254 |
| 5,872,051 | 2/1999 | Fallon et al. | 438/616 |
| 5,959,346 | 9/1999 | Ochiai | 257/618 |

FOREIGN PATENT DOCUMENTS

| | | |
|---|---|---|
| 4-263433 | 9/1992 | Japan . |
| 96-9245 | 3/1996 | Rep. of Korea . |
| 96-39233 | 11/1996 | Rep. of Korea . |

*Primary Examiner*—Randy Gulakowski
*Assistant Examiner*—Anita Alanko
*Attorney, Agent, or Firm*—Armstrong, Westerman, Hattori, McLeland & Naughton

[57] ABSTRACT

A method for fabricating a bump forming plate member by which bumps can be formed on an electronic component. A mask is formed on a surface of a crystalline plate, and the crystalline plate is subjected to anisotropic etching to form a plurality of grooves. The crystalline plate is also subjected to isotropic etching to deepen the grooves. The method can further includes additional anisotropic and isotropic etchings. Also, a method for fabricating a metallic bump forming plate member is disclosed. This method uses the above described crystalline plate having the grooves, and includes fabrication of a replica using the crystalline plate as an original, and fabrication of a metallic bump forming plate member using the replica as an original.

5 Claims, 7 Drawing Sheets

METHOD FOR FABRICATING BUMP FORMING PLATE MEMBER

BACKGROUND OF THE INVENTION

1. Field of the Invention

The present invention relates to a method for fabricating a bump forming plate member and a method for forming bumps such as solder bumps arranged at a predetermined pattern for mounting an electronic component such as a semiconductor chip to a printed circuit board.

2. Description of the Related Art

With recent requirement to make electronic apparatuses smaller and lighter, electronic components such as ICs and LSIs are made by including highly integrated elements on semiconductor chips, and the number of input and output terminals has increased to several hundreds, for example. In a known method for mounting the electronic components having such a large number of terminals to printed circuit boards, bumps such as solder bumps are formed on the surface of the electronic components in advance, and the bumps are fused to electrode pads on the printed circuit boards.

Figure 23:
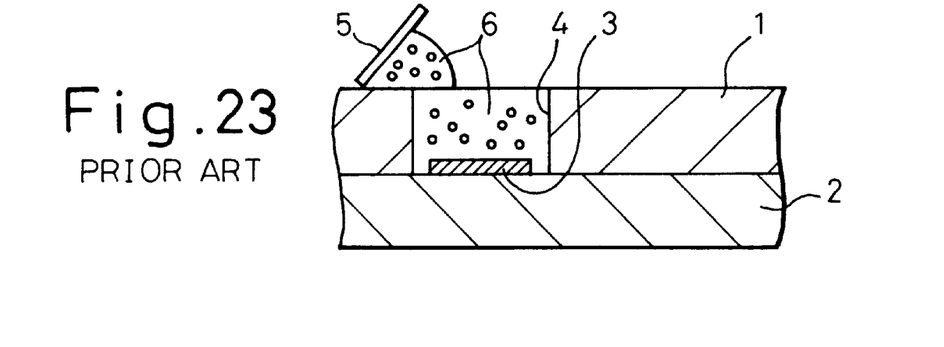
FIG. 23 is a cross-sectional view illustrating the solder paste transferring step by the conventional bump forming plate member having uniform through holes.

Conventionally, as means for forming bumps on the surface of the electronic components in advance, a plating method, a vapor deposition method, and a transferring method are known. FIG. 23 in the attached drawings shows a conventional bump transferring method, in which a bump forming plate member 1 is used on an electronic component 2 to transfer solder. The electronic component 2 has a plurality of electrode pads 3 arranged at a predetermined pattern, and the bump forming plate member 1 has through holes 4 arranged at a pattern corresponding to that of the electrode pads 3.

In the transfer process, the bump forming plate member 1 is placed on the electronic component 2 with the through holes 4 aligned with the electrode pads 3, and the solder paste 6 is filled in the through holes 4 of the bump forming plate member 1 by a squeegee 5. The bump forming plate member 1 is then lifted relative to the electronic component 2, so that the solder paste 6 is released from the through holes 4 of the bump forming plate member 1 and transferred to the electronic component 2. The electronic component 2 is then placed on a printed circuit board and heated, to mount the electronic component 2 onto the printed circuit board.

The problem of the transferring method of FIG. 23 is that when the bump forming plate member 1 is lifted relative to the electronic component 2, the solder paste 6 sometimes sticks to the wall surface of the through holes 4 of the bump forming plate member 1 and is not transferred to the electronic component 2. As the pitch of the pin arrangement of the recent electronic component 2 becomes smaller, the cross-sectional area of the through holes 4 of the bump forming plate member 1 becomes smaller, so the solder paste 6 is not released from the through holes 4 of the bump forming plate member 1.

Figure 22:
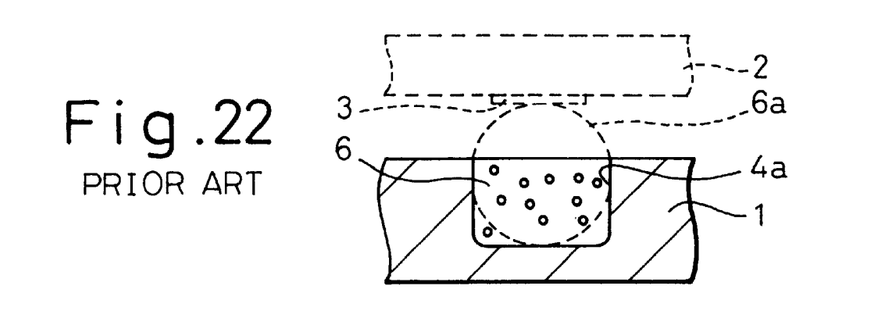
FIG. 22 is a cross-sectional view illustrating the conventional bump forming plate member having uniform grooves.

FIG. 22 in the attached drawings shows a bump transferring method described in Japanese Unexamined Patent Publication (Kokai) No. 4-263433. A bump forming plate member 1 has grooves 4a which are arranged at a pattern corresponding to that of the through holes 4 of FIG. 23. However, the grooves 4a are not through holes. In the case of FIG. 22 too, the solder paste 6 is filled in the grooves 4a of the bump forming plate member 1 by a squeegee 5. The bump forming plate member 1 is then placed on an electronic component 2, and the electronic component 2 and the bump forming plate member 1 are heated so that solder component in the solder paste 6 is rounded to form solder balls 6a which partly project from the surface of the bump forming plate member 1. When the electronic component 2 is lifted relative to the bump forming plate member 1 and the solder balls 6a are transferred from the bump forming plate member 1 to the electronic component 2.

In this transferring method, there is no problem as to the fact that the solder paste 6 sometimes sticks to the wall surface of the through holes 4 of the bump forming plate member 1. However, since the grooves 4a of the bump forming plate member 1 have a constant cross section from the top to the bottom thereof, the solder balls 6a formed by heating the solder paste 6 contact the side surface of the grooves 4a, there is a case in which the solder balls 6a falls off the grooves 4a when the electronic component 2 is lifted relative to the bump forming plate member 1.

Therefore, it is necessary to form the grooves 4a such that the grooves 4a have a relatively large cross section and a relatively small depth so that the solder balls 6a do not contact the side surface of the grooves 4a. However, this necessitates an increase in the pitch between two adjacent grooves 4a and cannot satisfy the narrow pitch requirements. In addition, when the bump forming plate member 1 is made from a material such as a stainless steel plate or a glass plate, it is possible to form grooves 4a in the surface of the stainless steel plate or the glass plate, by boring or drilling, or by etching. However, it is difficult to form the grooves 4a in such a manner that the grooves 4a have an identical shape and are arranged at a constant pitch.

Figure 21:
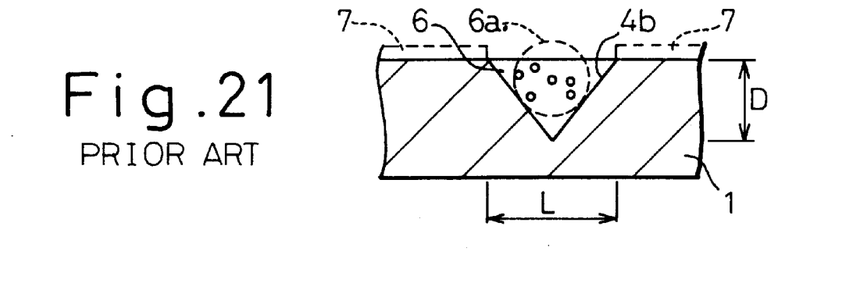
FIG. 21 is a cross-sectional view illustrating the conventional silicon bump forming plate member.

FIG. 21 in the attached drawings shows a further bump transferring method. A bump forming plate member 1 has grooves 4b which are arranged at a pattern corresponding to that of the through holes 4 of FIG. 22. In this case too, the solder paste 6 is filled in the grooves 4b of the bump forming plate member 1 by a squeegee 5 (not shown), solder balls 6a are formed by heating the solder paste 6, and the solder balls 6a are transferred from the bump forming plate member 1 to the electronic component 2 (not shown).

The bump forming plate member 1 shown in FIG. 21 is made from a crystalline plate such as silicon. The grooves 4b are formed by subjecting the crystalline plate to anisotropic etching. In this arrangement, it is possible to obtain the bump forming plate member 1 in such a manner that the grooves 4b have an identical shape and arranged at a constant pitch, and it is possible to form bumps on the electronic component 2 arranged at a constant narrow pitch, using the bump forming plate member 1.

The grooves 4b of the bump forming plate member 1 of FIG. 21 have a triangular shape in cross section with the wide top and the narrow bottom, so the solder balls 6a can be easily released off the grooves 4b without sticking thereto when the solder balls 6a are transferred from the bump forming plate member 1 to the electronic component 2.

When the grooves 4b are formed by subjecting the crystalline plate to anisotropic etching, it is possible to form the grooves 4b having an identical shape and arranged at a constant pitch, but the grooves 4b have a final shape in which the inner surface of the grooves 4b are inclined surfaces and the depth D of the grooves 4b is decided depending on the size L of the opening of the mask 7 (the lip of the groove 4b). When the pitch of the pin arrangement of the electronic component 2 becomes smaller, the size L of the lip of the groove 4b becomes smaller and the depth D of the grooves 4b becomes smaller. As a result, the size of the solder balls 6a thus formed becomes smaller.

In addition, the bump forming plate member 1 having the grooves 4b is made of a very thin crystalline plate, so it is relatively fragile. However, in the prior art, it is not possible to form small grooves 4b arranged at a small pitch if the bump forming plate member 1 is made of a metal plate. However, it is desired that the bump forming plate member 1 is made from metal and has the grooves 4b arranged at a small pitch.

SUMMARY OF THE INVENTION

The object of the present invention is to provide a method for fabricating a bump forming plate member, in which the bump forming plate member having a plurality of grooves is fabricated by subjecting a crystalline plate to anisotropic etching, and by which the deeper grooves can be formed in the bump forming plate member to thereby makes it possible to form bumps having a sufficient size on an electronic component at a small pitch, using such a bump forming plate member.

Another object of the present invention is to provide a method for fabricating a metallic bump forming plate member using a crystalline bump forming plate member as an original.

A further object of the present invention is to provide a method for forming bumps on an electronic component using a bump forming plate member.

According to one aspect of the present invention, there is provided a method for fabricating a bump forming plate member, the method comprising the steps of forming a mask on a surface of a crystalline plate, subjecting the crystalline plate to anisotropic etching to form a plurality of grooves in the surface of the crystalline plate, and subjecting the crystalline plate to isotropic etching, after the anisotropic etching step, to deepen the plurality of grooves in the surface of the crystalline plate, the crystalline plate being a bump forming plate member having a plurality of grooves in a surface thereof.

In this method, it is possible to fabricate a bump forming plate member having a plurality of grooves having an identical shape and arranged at a small pitch, by subjecting a crystalline plate to anisotropic etching, and it is also possible to deepen the grooves while the above described features are maintained, by subjecting the crystalline plate to isotropic etching.

Preferably, the method further comprises the steps of subjecting the crystalline plate to additional anisotropic etching and subjecting the crystalline plate to additional isotropic etching, after the first isotropic etching step.

Preferably, each of said grooves has a bill-shaped hole portion continuously extending from the bottom of said groove, the bill-shaped hole portion having a cross section smaller than that of the groove.

Preferably, the method further comprises the step of grinding a surface of the crystalline plate opposite from the surface having lips of the grooves so that inner ends of the grooves are exposed at the opposite surface. By this step, the inner ends of the grooves act as gas releasing holes, when bumps are formed using the bump forming plate member.

According to the second aspect of the present invention, there is provided a method for fabricating a bump forming plate member, the method comprising the steps of forming a mask on a surface of a crystalline plate, subjecting the crystalline plate to anisotropic etching to form a plurality of grooves in the surface of the crystalline plate, fabricating a replica using the crystalline plate as an original, and fabricating a metallic bump forming plate member using the replica as an original, the metallic bump forming plate member having a plurality of grooves in a surface thereof corresponding to the grooves of the crystalline plate.

In this method, it is possible to obtain a metallic bump forming plate member having a plurality of grooves, which is similar to a crystalline bump forming plate member having a plurality of grooves fabricated by subjecting a crystalline plate to anisotropic etching.

Preferably, the method further comprises the step of subjecting the crystalline plate to isotropic etching to further deepen the plurality of grooves in the surface of the crystalline plate, after the anisotropic etching step and before the metallic bump forming plate member fabricating step.

Preferably, the method further comprises the steps of subjecting the crystalline plate to additional anisotropic etching and subjecting the crystalline plate to additional isotropic etching, after the first isotropic etching step and before the metallic bump forming plate member fabricating step.

Preferably, the method further comprises the step of grinding a surface of the metallic bump forming plate member opposite from the surface having the grooves so that inner ends of the grooves are exposed at the opposite surface.

Preferably, the step of fabricating a replica using the crystalline plate as an original comprises plating the surface of the crystalline plate, the replica comprising a plated layer.

Preferably, the step of fabricating a metallic bump forming plate member using the replica as an original comprises plating the surface of the replica, the metallic bump forming plate member comprising a plated layer.

Preferably, the metallic bump forming plate member has the plurality of grooves having the shape of a rectangular pyramid.

Preferably, the metallic bump forming plate member has the plurality of grooves having the shape including a rectangular lip and a wedge-shaped bottom with oblique sides extending on either side of a linear deepest part.

Further, the present invention provides a method for forming bumps using a crystalline bump forming plate member or a metallic bump forming plate member, fabricated as described above. The method comprises the steps of filling the grooves of the bump forming plate member with solder paste, and heating the solder paste to transfer thus formed solder balls to an electronic component.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

FIGS. 1 to 4 show a method for fabricating a bump forming plate member according to the first embodiment of the present invention.

Figure 1:
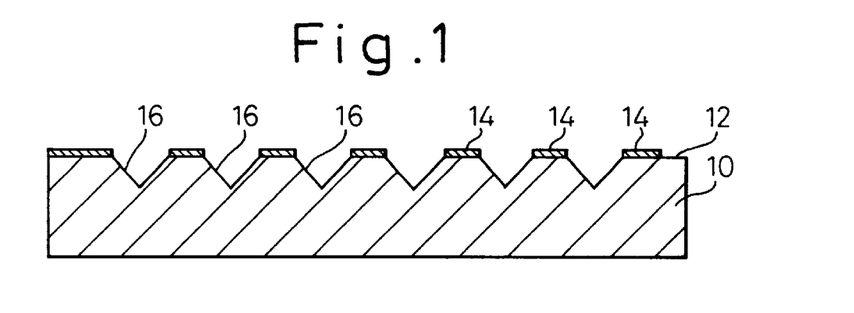
FIG. 1 is a cross-sectional view illustrating the anisotropic etching step in the method for fabricating a bump forming plate member according to the first embodiment of the present invention.

In FIG. 1, a silicon substrate 10, which is a crystalline plate, is prepared, and a mask 14 is formed on the surface 12 of the silicon substrate 10. The mask 14 comprises an oxide film ($SiO_2$) or a nitride film (SiN) which is treated by photolithography process to form the mask 14 having openings. For example, a resist is applied on the oxide film, a portion of the resist corresponding to the openings of the mask 14 is exposed to remove the exposed portion, a portion of the oxide film corresponding to the openings of the mask 14 is removed by HF, and the remaining portion of the resist is cleaned.

The silicon substrate 10 with the mask 14 is then subjected to anisotropic etching using KOH solution, to form a plurality of grooves 16 in the surface 12 of the silicon substrate 10.

Figure 2:
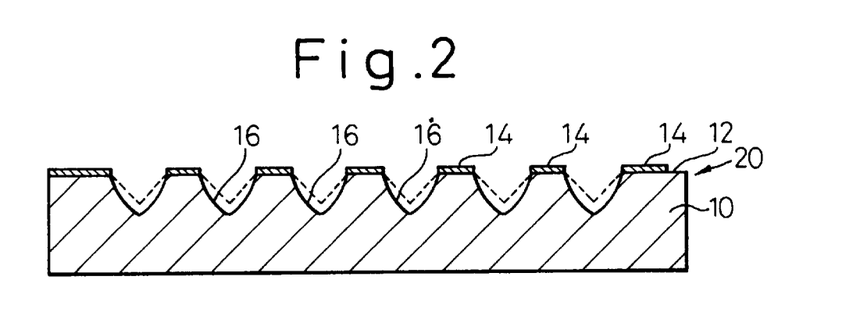
FIG. 2 is a cross-sectional view illustrating the isotropic etching step, after the anisotropic etching step in FIG. 1.

The silicon substrate 10 with the mask 14 is then subjected to isotropic etching using a solution of HF and nitric acid, to further deepen the grooves 16 in the surface 12 of the silicon substrate 10, as shown in FIG. 2. Note that the grooves 16 are not enlarged when anisotropic etching is continued in the condition of FIG. 1, but the grooves 16 are enlarged and deepened by carrying out isotropic etching after the condition of FIG. 1, as shown in FIG. 2. In this case, the isotropic etching may advance to some degree into a portion of the silicon substrate 10 under the mask 14.

It is possible to use the silicon substrate 10 having depended grooves 16 as a bump forming plate member 20.

Figure 3:
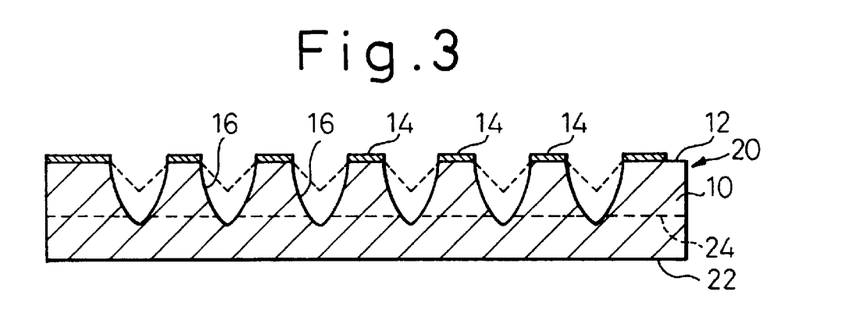
FIG. 3 is a cross-sectional view illustrating the additional anisotropic and isotropic etching steps, after the isotropic etching step in FIG. 2.

If it is desired to further deepen the grooves 16 in the surface 12 of the silicon substrate 10, the silicon substrate 10 is subjected to additional anisotropic etching and to additional isotropic etching, after the first isotropic etching step. By these additional etchings, the grooves 16 are further deepened. It is also possible to repeat anisotropic etching and isotropic etching, whereby the grooves 16 are further deepened while the degree of development of the etching into a portion of the silicon substrate 10 under the mask 14 is minimized.

Figure 4:
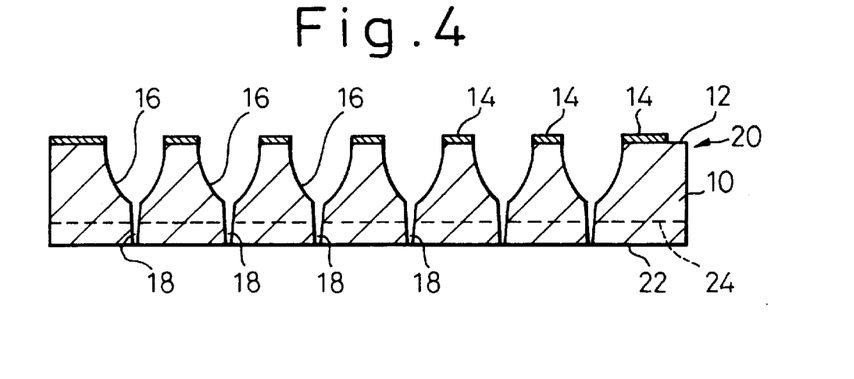
FIG. 4 is a cross-sectional view illustrating the formation of a small bill-shaped hole portion extending from the central, bottom of the groove of the crystalline plate during the additional anisotropic and isotropic etching steps.

It is also possible to form a bill-shaped (long and narrow) hole portion 18 continuously extending from the central, bottom of the groove 16 of the silicon substrate 10 during the additional anisotropic and isotropic etching steps, the bill-shaped hole portion 18 having a cross section smaller than that of the groove 16. It is possible to form the bill-shaped hole portion 18 so that it opens to the opposite surface 22 of the silicon substrate 10.

It is also possible to carry out anisotropic dry etching using $CF_4$ or $CHF_3$, for example. The depth of the groove 16 formed by anisotropic dry etching using $CF_4$ or $CHF_3$ will be a little deeper than the depth of the groove 16 formed by anisotropic etching using KOH solution. Therefore, it is possible to obtain the small and deep bill-shaped hole portion 18, by conducting anisotropic dry etching after isotropic etching (although the hole portion 18 is shown in an exaggerated manner). Also, it is possible to use anisotropic wet etching and anisotropic dry etching in combination, along with isotropic etching.

In this way, it is possible to use the silicon substrate 10 of FIG. 3 or the silicon substrate 10 of FIG. 4 as a bump forming plate member 20.

In addition, in FIGS. 3 and 4, the surface 22 of the silicon substrate 10 opposite from the surface 12 having lips of the grooves 16 is ground to a level 24 so that inner ends of the grooves 16 are exposed at the opposite surface 24. By this arrangement, the inner ends of the grooves 16 act as gas releasing holes, when bumps are formed using the bump forming plate member 20. It is also possible to grind the opposite surface 22 of the silicon substrate 10 to FIG. 2.

Figure 5:
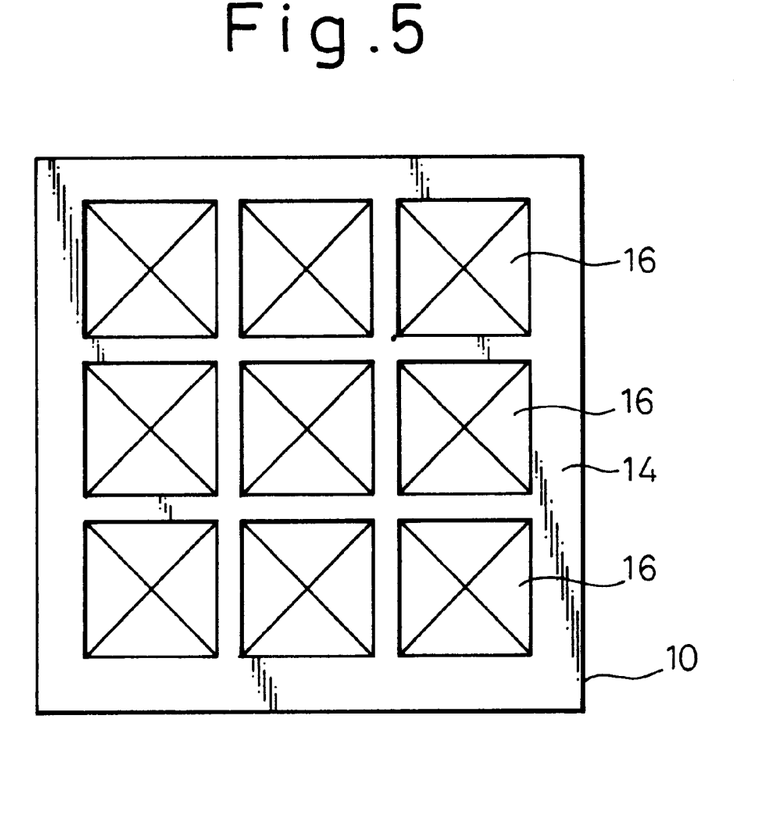
FIG. 5 is a plan view of the crystalline plate subjected to anisotropic etching.
Figure 6:
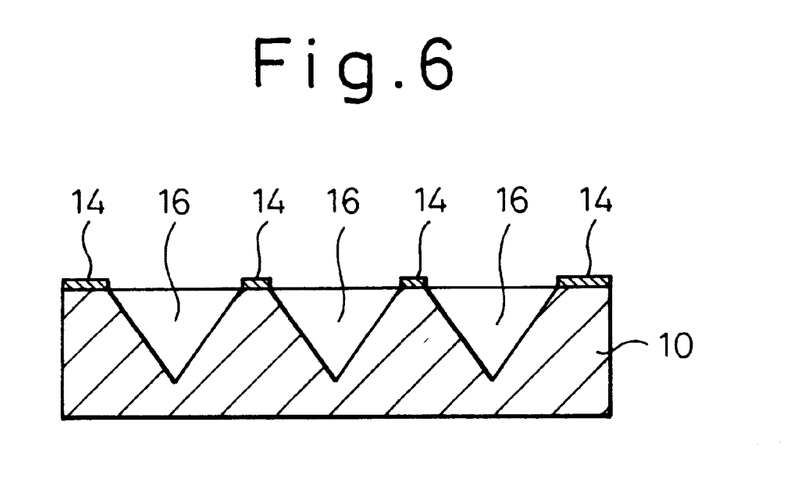
FIG. 6 is a cross-sectional view of the crystalline plate of FIG. 5.

FIGS. 5 and 6 show the shape of the grooves 16 of the silicon substrate 10 in the step of FIG. 1 when the surface 12 of the silicon substrate 10 is a <100> crystalline plane. In this case, each of the grooves 16 has a shape of a rectangular pyramid. When isotropic etching and anisotropic etching are repeated, the entire rectangular pyramidal shape of the grooves 16 is substantially maintained unchanged while the entire shape of the grooves 16 is somewhat rounded and deepened.

Figure 7:
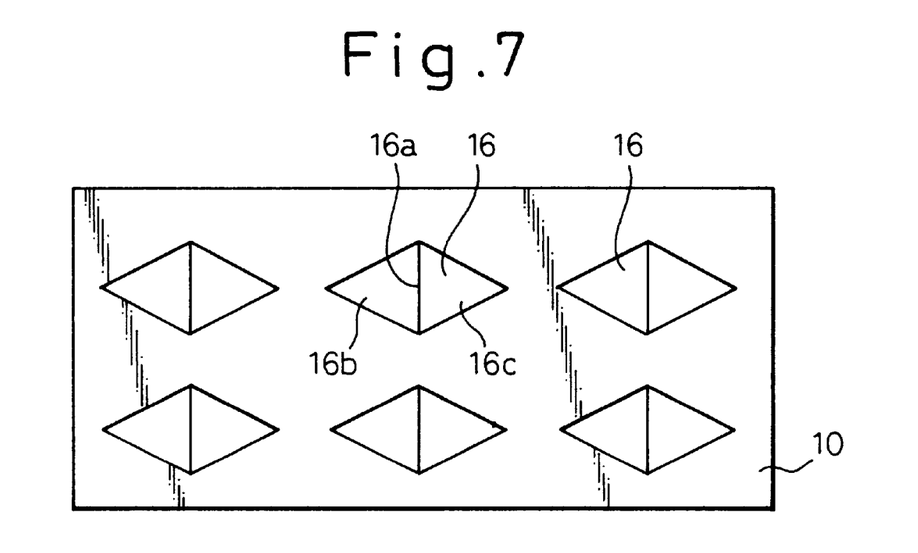
FIG. 7 is a plan view of the crystalline plate subjected to anisotropic etching according to another example.
Figure 8:
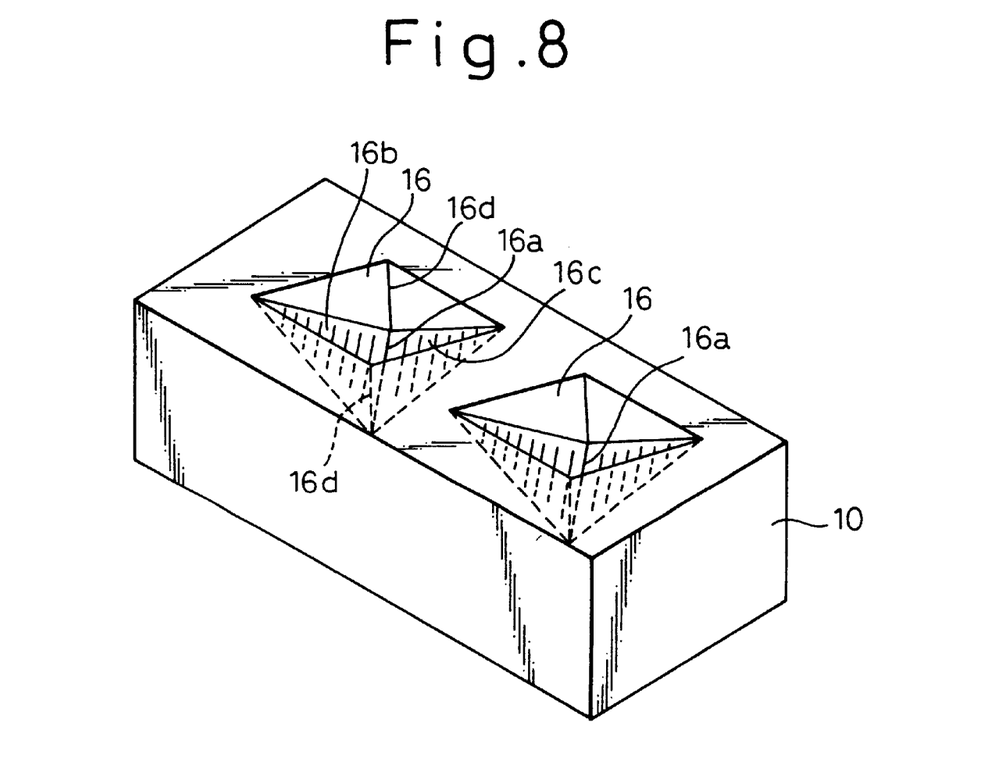
FIG. 8 is a diagrammatic perspective view of the crystalline plate of FIG. 7.

FIGS. 7 and 8 show the shape of the grooves 16 of the silicon substrate 10 in the step of FIG. 1 when the surface 12 of the silicon substrate 10 is a <100> crystalline plane. In this case, each of the grooves 16 has a shape including a rectangular lip and a wedge-shaped bottom with oblique sides 16b and 16c extending on either side of a linear deepest part 16a. Lines 16d vertically extend from two corners on one diagonal of the rectangular lip to the ends of the linear deepest part 16a. In this case too, when isotropic etching and anisotropic etching are repeated, the shape of the grooves 16 is substantially maintained unchanged while the entire shape is somewhat rounded and deepened.

Figure 9:
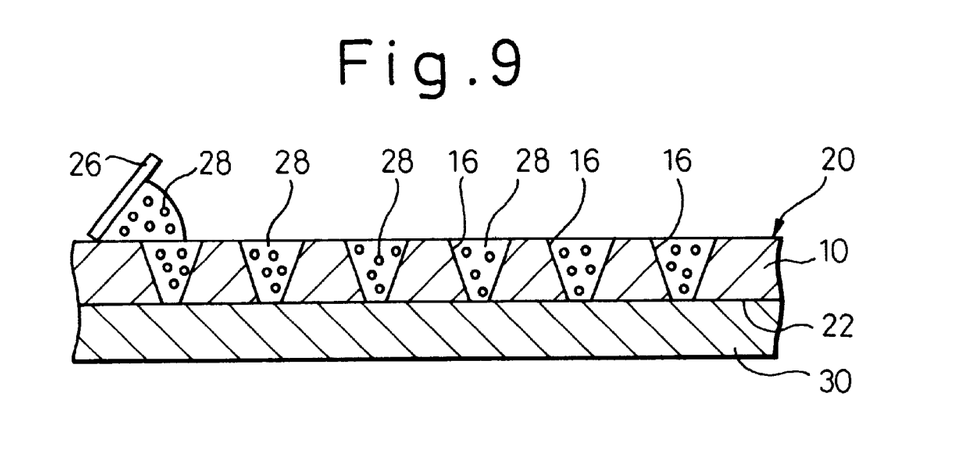
FIG. 9 is a cross-sectional view illustrating the step of filling the solder paste in the grooves of the bump forming plate member to illustrate an example of a method for forming solder bumps using the bump forming plate member.
Figure 10:
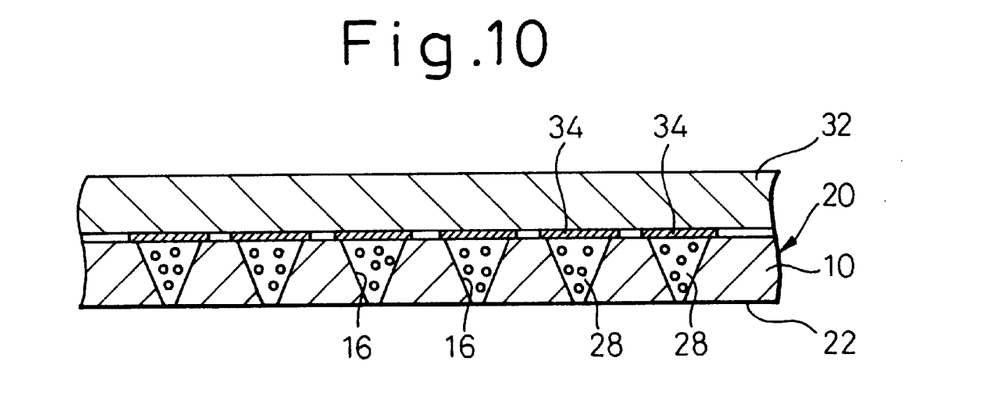
FIG. 10 is a cross-sectional view of the solder transferring step by placing the electronic component on the bump forming plate member of FIG. 9.
Figure 11:
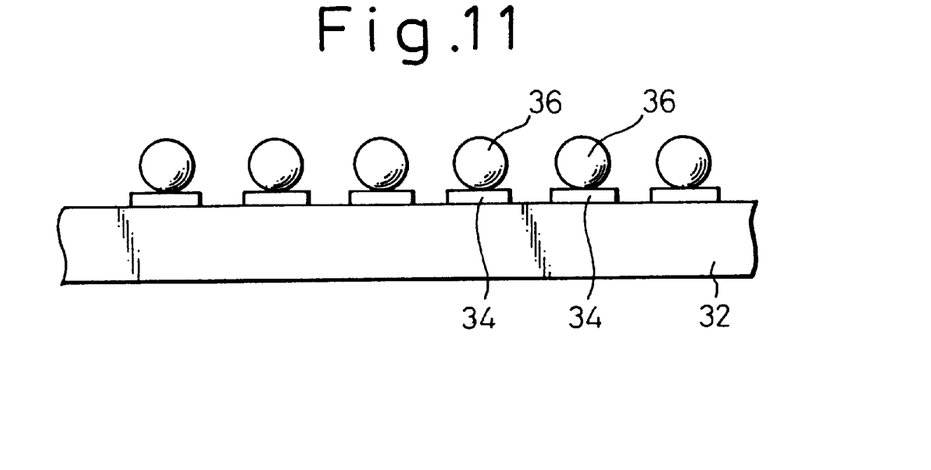
FIG. 11 is a side view illustrating the electronic component having transferred solder balls.

FIGS. 9 to 11 show an example of a method for forming solder bumps using the bump forming plate member 20 of FIGS. 2 to 4. Solder paste 28 is filled in the grooves 16 in the surface 12 of the bump forming plate member 20, using a squeegee 26, as shown in FIG. 9. The grooves 16 are shown in a simplified shape, and the bump forming plate member 20 is formed so that the inner ends of the grooves 16 open at the opposite surface 22 (24) of the bump forming plate member 20. When the solder paste 28 is filled in the grooves 16, a support plate 30 is used on the opposite surface 22 (24) of the bump forming plate member 20, so that the solder paste 28 does not leak from the inner ends of the grooves 16.

The pitch between the two adjacent grooves 16 is 200 µm and the length of one side of the lip of the grooves 16 is 180 µm, for example. On contrast, the depth of the grooves 16 (the thickness of the silicon plate 10 after grinding) is 0.2 mm, for example. Note that the mask 14 on the silicon plate 10 is removed before the bump forming plate member 20 is used. The solder paste 28 comprises a creamy soldering material and solder particles mixed in the creamy soldering material. The solder particles have a diameter ranging from 15 to 30 µm, for example. The size of the openings of the inner ends of the grooves 16 is 30 µm, for example.

In FIG. 10, an electronic component 32 such as a silicon chip is placed on the bump forming plate member 20, with electrode pads 34 of the electronic component 32 positioned on the grooves 16 of the bump forming plate member 20. The electronic component 32 and the bump forming plate member 20 are then heated to a temperature higher than a melting point of the solder plus approximately 30° C., so that the solder in the solder paste 28 is molten and transferred to the electrode pads 34 of the electronic component 32.

When the bump forming plate member 20 is heated, the solder in the solder paste 28 in the grooves 16 is molten and rounded to solder balls 36 due to surface tension, as shown in FIG. 11. The solder balls 36 are adhered to the electrode pads 34 of the electronic component 32. Also, when the bump forming plate member 20 is heated, a volatile component in the solder paste 28 forms a gas. The gas is released from the openings of the grooves 16 at the inner ends thereof. if the inner ends of the grooves 16 are not opened, there is no way through which the gas can be released, and the gas tends to be released from the gap between the electronic component 32 and the bump forming plate member 20, causing the electronic component 32 to float above the bump forming plate member 20, and the solder to be peeled off the electrode pads.

By removing the electronic component 32 from the bump forming plate member 20, the solder balls 36 are adhered to the electrode pads 34 of the electronic component 32 and form bumps.

Figure 12:
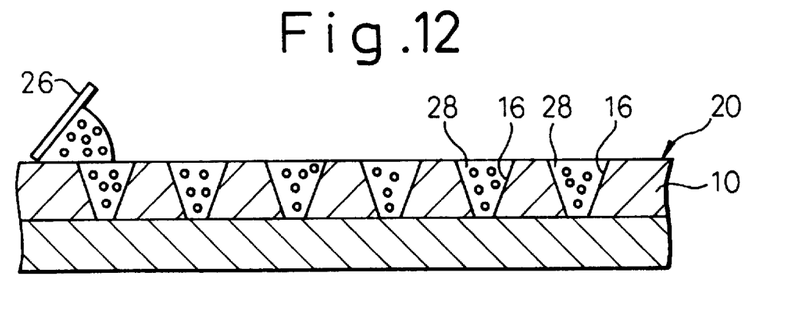
FIG. 12 is a cross-sectional view illustrating the step of filling the solder paste in the grooves of the bump forming plate member to illustrate another example of a method for forming solder bumps using the bump forming plate member.

FIGS. 12 to 15 show another example of a method for forming solder bumps using the bump forming plate member 20 of FIGS. 1 to 4. Solder paste 28 is filled in the grooves 16 in the surface 12 of the bump forming plate member 20, using a squeegee 26, as shown in FIG. 12. When the solder paste 28 is filled in the grooves 16, a support plate 30 is used on the opposite surface 22 (24) of the bump forming plate member 20, so that the solder paste 28 does not leak from the inner ends of the grooves 16.

Figure 13:
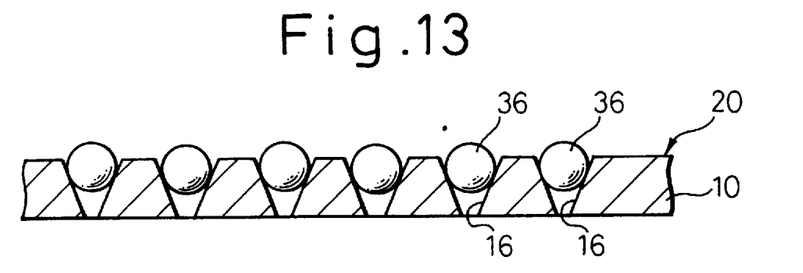
FIG. 13 is a cross-sectional view illustrating the step of heating the bump forming plate member of FIG. 12 to form solder balls.

In FIG. 13, when the bump forming plate member 20 is heated, the solder in the solder paste 28 in the grooves 16 is molten and rounded to solder balls 36 due to surface tension. In this case, it is not necessary that the inner ends of the grooves 16 are opened.

Figure 14:
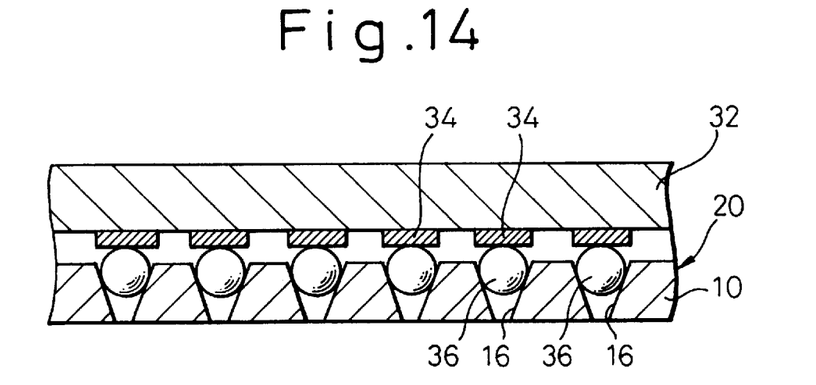
FIG. 14 is a cross-sectional view of the solder transferring step by placing the electronic component on the bump forming plate member of FIG. 13.
Figure 15:
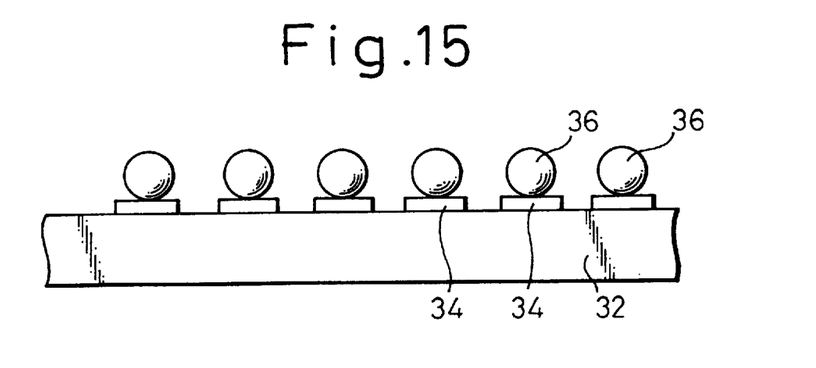
FIG. 15 is a side view illustrating the electronic component having transferred solder balls.

In FIG. 14, an electronic component 32 such as a silicon chip is placed on the bump forming plate member 20, with electrode pads 34 of the electronic component 32 positioned on the solder balls 36 in the grooves 16 of the bump forming plate member 20. The transferring pressure of the bumps is 5 to 10 g/bump, for example. The electronic component 32 and the bump forming plate member 20 are then heated to a temperature higher than a melting point of the solder plus approximately 30° C., to transfer the solder balls 36 from the bump forming plate member 20 to the electronic component 32. The solder balls 36 are adhered to the electrode pads 34 of the electronic component 32 to form bumps, by removing the electronic component 32 from the bump forming plate member 20, as shown in FIG. 15.

FIGS. 16 to 19 shows a method for fabricating a bump forming plate member according to the second embodiment of the present invention. This embodiment uses the silicon substrate 10 of FIGS. 2 to 4. The silicon substrate 10 is not used as the bump forming plate member 20, but it is used as an original for fabricating a metallic bump forming plate member. The silicon substrate 10 of FIGS. 2 to 4 is obtained by forming a mask 14 on a surface 12 of a silicon substrate 10 which is a crystalline plate, as shown in FIG. 1, and by subjecting the silicon substrate 10 to anisotropic etching, to form a plurality of grooves 16 in the surface 12 of the silicon substrate 10. In this example, the silicon substrate 10 may be one that is subjected to anisotropic etching only, or one that is subjected to isotropic etching after the anisotropic etching step, or one that is further subjected to anisotropic etching and isotropic etching after the first isotropic etching step. In addition, the grooves 16 can include open inner ends or may not include open inner ends.

Figure 16:
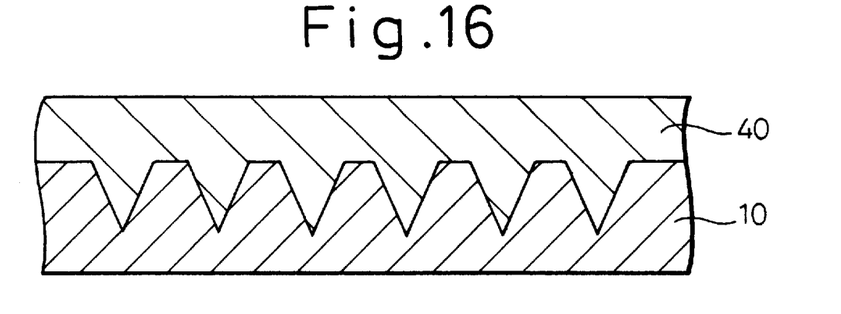
FIG. 16 is a cross-sectional view illustrating the replica fabricating step to illustrate the fabrication of the metallic bump forming plate member using the silicon substrate of FIGS. 2 to 4.
Figure 17:
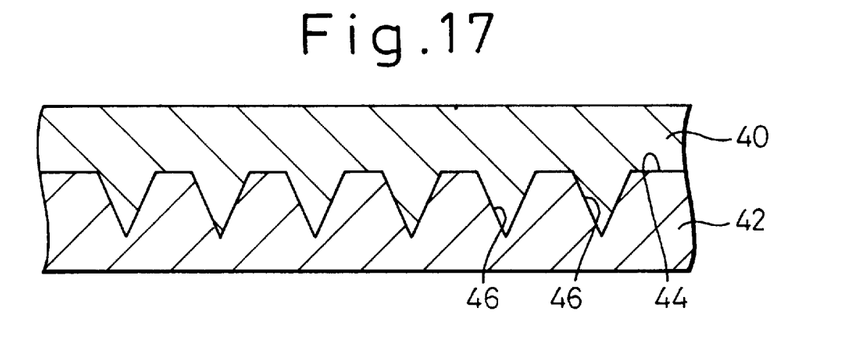
FIG. 17 is a cross-sectional view illustrating the metallic bump forming plate member using the replica of FIG. 16.

In FIG. 16, the silicon substrate 10 is inserted in a plating tank (not shown) with the silicon substrate 10 used as one of the electrodes, to plate the silicon substrate 10 with nickel or 42 alloy. A replica 40 having a complimentary shape to that of the silicon substrate 10 having the grooves 16 is thus formed on the silicon substrate 10. The replica 40 comprises a layer of nickel or 42 alloy having the thickness of approximately 100 µm, for example. in FIG. 17, after the replica 40 is removed from the silicon substrate 10, the replica 40 is used as an original for fabricating a metallic bump forming plate member 42. The replica 40 is inserted in a plating tank (not shown) with the replica 40 used as one of the electrodes, to plate the replica 40 with nickel or 42 alloy. The metallic bump forming plate member 42 having a complimentary shape to that of the replica 40 is thus formed on the replica 40.

Figure 18:
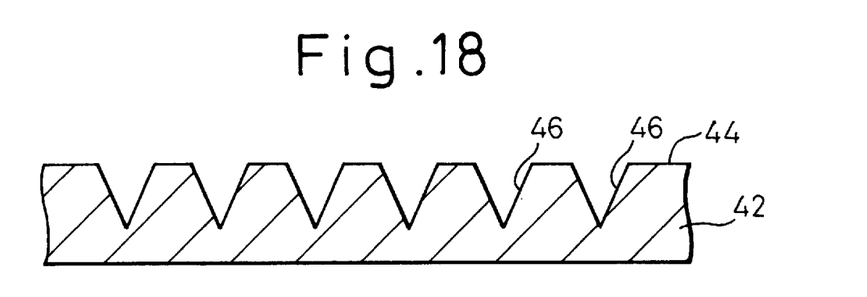
FIG. 18 is a cross-sectional view illustrating the metallic bump forming plate member.

In FIG. 18, the metallic bump forming plate member 42 is removed from the replica 40. The metallic bump forming plate member 42 has a surface 44 having grooves 46 corresponding to the surface 12 having the grooves 16 of the silicon plate 10, and the surface 44 with the grooves 46 is plated with chrome so that the solder can be easily released from the grooves 46 in the surface 44. It will be apparent that the metallic bump forming plate member 42 is used to form solder bumps on the electronic component 32 in a manner similar to that shown in FIGS. 9 to 15 in which the bump forming plate member 20 comprising the silicon substrate 10 is used.

Figure 19:
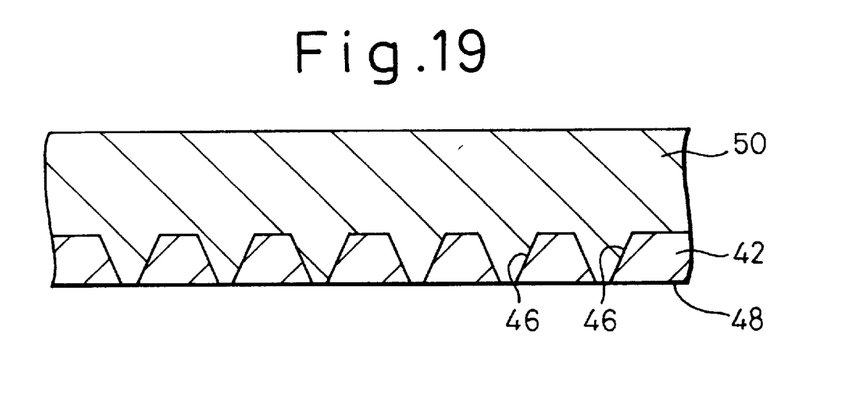
FIG. 19 is a cross-sectional view illustrating the grinding step for grinding the surface of the metallic bump forming plate member opposite from the surface thereof having lips of the grooves.
Figure 20:
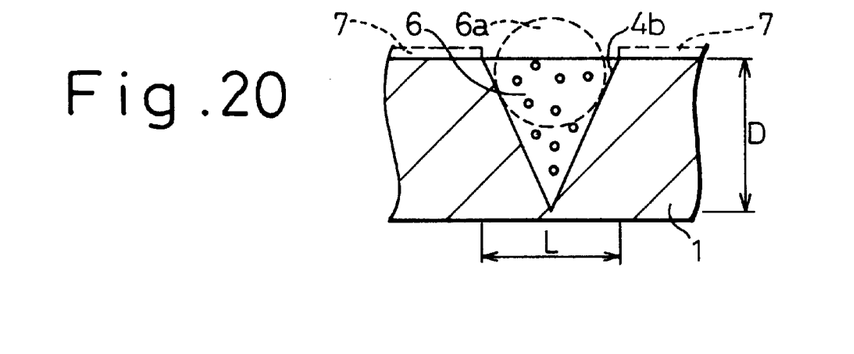
FIG. 20 is a cross-sectional view illustrating the bump forming plate member having deep grooves.

In addition, in FIG. 19, after the metallic bump forming plate member 42 is formed, the surface 48 of the metallic bump forming plate member 42 opposite from the surface 44 having lips of the grooves 46 is ground so that inner ends of the grooves 46 are exposed at the opposite surface 48. In this case, since the metallic bump forming plate member 42 is thin and soft, a backing support plate 50 such as a paraffin plate is applied to the metallic bump forming plate member 42 and the surface 48 of the metallic bump forming plate member 42 is ground. The metallic bump forming plate member 42 fabricated in this way makes it possible to form bumps on a warped surface and provides for a prolonged operational life.

What is claimed is:

1. A method for fabricating a bump forming plate member, said method comprising the steps of:

forming a mask on a surface of a crystalline plate, wherein the crystalline plate is the plate member;

subjecting said crystalline plate to anisotropic etching to form a plurality of grooves in the surface of said crystalline plate; and subjecting said crystalline plate to isotropic etching, after said anisotropic etching step, to deepen said plurality of grooves in the surface of said crystalline plate.

2. The method according to claim 1, further comprising the steps of subjecting said crystalline plate to additional anisotropic etching and subjecting said crystalline plate to additional isotropic etching, after said first isotropic etching step.

3. The method according to claim 1, wherein each of said grooves has a bill-shaped hole portion continuously extending from the bottom of said groove, the bill-shaped hole portion having a cross section smaller than that of the groove.

4. The method according to claim 1, further comprising the step of grinding a surface of said crystalline plate opposite from said surface having lips of said grooves so that inner ends of said grooves are exposed at said opposite surface.

5. A method for forming bumps using a bump forming plate member fabricated by forming a mask on a surface of a crystalline plate, wherein the crystalline plate is the plate member, subjecting said crystalline plate to anisotropic etching to form a plurality of grooves in the surface of said crystalline plate, and subjecting said crystalline plate to isotropic etching, after said anisotropic etching step, to deepen said plurality of grooves in the surface of said crystalline plate, said method comprising the steps of:

filling said grooves of said bump forming plate member with solder paste; and heating the solder paste to transfer thus formed solder balls to an electronic component.

* * * * *